(12) United States Patent
Couillard et al.

(10) Patent No.: US 11,525,850 B2
(45) Date of Patent: Dec. 13, 2022

(54) METHOD AND APPARATUS FOR MONITORING CAPACITOR FAULTS IN A CAPACITOR BANK

(71) Applicant: GENTEC INC., Québec (CA)

(72) Inventors: Benjamin Couillard, Québec (CA); Eric Thibodeau, Québec (CA); Félix Pelletier, Québec (CA)

(73) Assignee: GENTEC INC., Quebec (CA)

( * ) Notice: Subject to any disclaimer, the term of this patent is extended or adjusted under 35 U.S.C. 154(b) by 235 days.

(21) Appl. No.: 16/773,284

(22) Filed: Jan. 27, 2020

(65) Prior Publication Data

US 2020/0241060 A1     Jul. 30, 2020

Related U.S. Application Data

(60) Provisional application No. 62/797,546, filed on Jan. 28, 2019.

(51) Int. Cl.
| | |
|---|---|
| *G01R 27/26* | (2006.01) |
| *G01R 31/01* | (2020.01) |
| *G01R 31/40* | (2020.01) |
| *H02J 3/00* | (2006.01) |

(52) U.S. Cl.
CPC ....... *G01R 27/2605* (2013.01); *G01R 31/016* (2013.01); *G01R 31/40* (2013.01); *H02J 3/001* (2020.01)

(58) Field of Classification Search
CPC ........ G01R 27/00; G01R 27/02; G01R 27/26; G01R 27/2605; G01R 31/00; G01R 31/01; G01R 31/013; G01R 31/016; G01R 31/40; G01R 31/50; G01R 31/64; H02J 3/00; H02J 3/001; H02J 3/0012; H02J 3/18; Y02E 40/00; Y02E 40/30; G01D 5/00; G01D 5/12; G01D 5/14; G01D 5/24; G01D 5/2405; G01D 5/241; G01D 5/2412; G01D 5/2417
See application file for complete search history.

(56) References Cited

U.S. PATENT DOCUMENTS

2015/0241503 A1 *    8/2015    Bhandarkar ......... H02M 1/126
                                                             363/44

FOREIGN PATENT DOCUMENTS

| CN | 106646324 A | * | 5/2017 | ............ G01R 35/02 |
| EP | 1198715 B1 | * | 5/2003 | ......... G01R 27/2605 |
| WO | WO-2012081892 A1 | * | 6/2012 | ............ G01R 31/028 |
| WO | WO-2019219197 A1 | * | 11/2019 | ............ G01R 31/64 |

* cited by examiner

*Primary Examiner* — Hoai-An D. Nguyen
(74) *Attorney, Agent, or Firm* — Wiggin and Dana LLP

(57) ABSTRACT

A method and an apparatus are presented which enable the identification of a capacitor fault in a given string of a capacitor bank, based on the computation of the string impedance by measuring the string AC current and voltages, where each string includes a plurality of capacitor elements connected in series. The method consists of measuring the string capacitive impedance and comparing this value with a previously measured capacitive impedance of the same string. If a difference between these two values is obtained, which exceeds a given threshold for a certain duration, a fault is recorded.

25 Claims, 10 Drawing Sheets

APPARATUS FOR PROVIDING
AN INDICATION OF A
CAPACITOR FAULT

APPARATUS FOR PROVIDING
AN INDICATION OF A
CAPACITOR FAULT

METHOD AND APPARATUS FOR MONITORING CAPACITOR FAULTS IN A CAPACITOR BANK

FIELD

The invention relates to a digital protection relay for protecting power systems. More precisely, one or more embodiments of the invention pertain to a method and an apparatus for monitoring capacitor faults in a capacitor bank connected to an AC system.

BACKGROUND

Protecting the three-phase electrical grid and related equipment from unplanned device short-circuit is very desirable.

Transport and distribution lines of the electrical grid are inductive in nature and they connect to a load that is also inductive in nature. Therefore, capacitor banks are required for supplying the reactive power absorbed by the connected lines and loads.

These capacitor banks are distributed throughout the electrical network and operate at various voltage levels, as known to the skilled addressee.

In many cases, high voltage capacitor banks are formed by connecting multiple capacitor elements in series to form a capacitor string and by paralleling a certain number of such capacitor strings, thus resulting in a high number of capacitor elements in a given capacitor bank.

Unfortunately, a high number of capacitor elements comes with a higher failure probability, where a capacitor failure will result in a variation of the capacitor string impedance and, in such an event, in a higher voltage applied across every other capacitor in the string where the failure has occurred.

One prior art method used for determining if a capacitor bank contains a failed capacitor is by measuring the current flowing in the neutral connection of the three-phase capacitor bank and detecting upon any imbalance of the bank impedance. Another prior art method is by measuring the bank impedance for each of the three phases and generating an alarm after detecting a variation in the measurement of the bank impedance of the phase considered. Unfortunately, a limitation of these two methods is the lack of precision with respect to the exact location of the faults within a capacitor bank and possible early tripping of the protection circuit breaker thereof, leading to unnecessary down-time. For example, 5 short-circuited capacitor elements could be fatal to the capacitor bank when occurring in the same capacitor string, whereas 5 short-circuited capacitor elements in 5 separate strings can be sustained for a long period of time. A more sophisticated and accurate prior art method consists in measuring the impedance of each string of the capacitor bank and actuating the circuit breaker in series with the bank only if the variation in one of the string impedances exceeds a programmed threshold.

However, a drawback of this prior art method derives from the fact that each capacitor element may present a natural variation of its capacitance value with its case temperature, leading to an overall string impedance variation of a few percent within a 24-hour period associated to the effect of the surrounding temperature which may result in a false alarm to be issued.

There is therefore a need for a method and apparatus that will overcome at least one of the above-identified drawbacks.

BRIEF SUMMARY

According to a broad aspect, there is disclosed a method for providing an indication of a capacitor fault in a given string of a capacitor bank comprising at least one string mounted in parallel, each string comprising a plurality of capacitor elements connected in series, the method comprising obtaining a capacitor bank voltage, the obtaining comprising measuring a voltage across the capacitor bank; obtaining a current of the given string, the obtaining of the current of the given string comprising measuring a current flowing in the given string of the capacitor bank; determining a measured impedance at a grid frequency using the obtained capacitor bank voltage and the obtained current of the given string and providing an indication of a capacitor fault if a difference between the measured impedance and a previously measured impedance exceeds a first given fast change threshold for a first given duration.

In accordance with one or more embodiments, the indication of a capacitor fault is also provided if a difference between a delayed measured impedance and a filtered impedance generated by filtering the measured impedance exceeds a second given threshold for a second given duration, the filtering comprising performing a temporal filtering for removing fast variations of the determined impedance over time.

In accordance with one or more embodiments, the indication of a capacitor fault is also provided if a fast variation of impedance is detected using at least one filter.

In accordance with one or more embodiments, the filtering of the measured impedance comprises providing the measured impedance if the difference between the measured impedance and a previously measured impedance exceeds the second given threshold for a second given duration.

In accordance with one or more embodiments, the method further comprises counting a number of capacitor fault provided for the given string of the capacitor bank over a given period of time and storing an indication of said number in a memory.

In accordance with one or more embodiments, the method further comprises storing an indication of the difference between the measured impedance and a previously measured impedance if the difference between the measured impedance and a previously measured impedance exceeds a first given threshold for a first given duration.

In accordance with one or more embodiments, the indication of the difference stored comprises at least one of an amplitude value and a percentage of a nominal value of a capacitor element.

In accordance with one or more embodiments, the method further comprises adding each of the stored indication of the difference over a given time duration of interest.

In accordance with one or more embodiments, the method further comprises computing a string impedance drift for the given string, the computing comprising multiplying the number stored in the memory by a corresponding impedance of a capacitor element of the given string of the capacitor bank.

In accordance with one or more embodiments, there is disclosed a method for identifying a defect in a capacitor bank comprising performing the method disclosed above for each string of the at least one string of the capacitor bank.

In accordance with one or more embodiments, the second given threshold is equal to a proportion of a corresponding nominal impedance of a healthy capacitor element of the string.

In accordance with one or more embodiments, the fast variations are characterized by a frequency greater than $\frac{1}{5}$ Hz.

In accordance with a broad aspect, there disclosed an apparatus for providing an indication of a capacitor fault in a given string of a capacitor bank comprising at least one string mounted in parallel, each string comprising a plurality of capacitor elements connected in series, the apparatus comprising a voltage measuring unit operatively connected to a capacitor bank, the voltage measuring unit for measuring a voltage across the capacitor bank and providing a signal indicative of the voltage; a current measuring unit operatively connected to the given string, the current measuring unit for measuring a current flowing in the given string and providing a signal indicative of the current flowing in the given string; a memory unit and a processing unit operatively connected to the voltage measuring unit, to the current measuring unit and to the memory unit, the processing unit receiving the signal indicative of the voltage and the signal indicative of the current flowing in the given string and determining a measured impedance at a grid frequency using the signal indicative of the voltage and the signal indicative of the current flowing in the given string, the processing unit further generating and providing an indication of a capacitor fault if the processing device determines that a difference between the measured impedance and a previously measured impedance stored in the memory unit exceeds a first given threshold for a first given duration.

In accordance with one or more embodiments, the processing unit further provides the indication of a capacitor fault if the processing unit determines that a difference between a delayed measured impedance and a filtered impedance generated by filtering the measured impedance exceeds a second given threshold for a second given duration, the filtering comprising performing a temporal filtering for removing fast variations of the determined impedance over time.

In accordance with one or more embodiments, the filtering of the measured impedance comprises providing the measured impedance if the difference between the measured impedance and a previously measured impedance exceeds the second given threshold for a second given duration.

In accordance with one or more embodiments, the processing unit further determine a number of capacitor faults provided for the given string of the capacitor bank over a given period of time and further stores an indication of said number in the memory unit.

In accordance with one or more embodiments, the processing unit stores an indication of the difference between the measured impedance and a previously measured impedance if the difference between the measured impedance and a previously measured impedance exceeds a first given threshold for a first given duration.

In accordance with one or more embodiments, the indication of the difference stored comprises at least one of an amplitude value and a percentage of a nominal value of a capacitor element.

In accordance with one or more embodiments, the processing unit further add each of the stored indication of the difference over a given time duration of interest.

In accordance with one or more embodiments, the processing unit further computes a string impedance drift for the given string, the computing comprising multiplying the number stored in the memory unit by a corresponding impedance of a capacitor element of the given string of the capacitor bank.

In accordance with one or more embodiments, the second given threshold is equal to a proportion of a corresponding nominal impedance of a healthy capacitor element of the string.

In accordance with one or more embodiments, the apparatus further comprises a display unit operatively connected to the processing unit, the display unit for providing the indication of a capacitor fault.

In accordance with one or more embodiments, the apparatus further comprises a communication unit operatively connected to the processing unit, the communication unit for providing the indication of a capacitor fault to a remote processing unit operatively connected to the communication unit.

In accordance with one or more embodiments, the processing unit generates and provides an alarm signal if the number of capacitor fault reaches a given number.

In accordance with one or more embodiments, the indication of a capacitor fault comprises an indication of a defective capacitor.

In accordance with one or more embodiments, the measuring of the current flowing in the given string of the capacitor bank comprises measuring a voltage at a corresponding capacitive current sensor located in the given string.

In accordance with one or more embodiments, the measuring of the voltage is performed via an insulating transformer.

BRIEF DESCRIPTION OF THE DRAWINGS

In order that the invention may be readily understood, one or more embodiments of the invention are illustrated by way of example in the accompanying drawings. In the drawings:

FIG. 1a shows a three-phase network with three capacitors connected between each of the three phases A, B, C and the common neutral connection. FIG. 1b shows the internal layout of a high-voltage capacitor bank connected to one of the three phases, wherein the capacitor bank contains a number of strings connected in parallel, each of which contains a number of capacitor elements connected in series within a given string.

In FIG. 4 is also depicted a short impedance variation occurring at time 18 hour during a grid transient.

FIG. 7a illustrates the effect of the grid transient on the measured impedance, whereas FIG. 7b illustrates that no capacitor fault is generated upon detecting a grid transient not associated to the failure of a capacitor element.

In FIG. 8a, the measured impedance is shown as a function of time for a 40-hour time duration, including a slight reduction in the total string impedance after the fault has occurred, whereas FIG. 8b displays the effect of the fault on the output of the low-pass filter, in a preferred embodiment.

FIG. 9a illustrates the effect of the capacitor failure on the measured impedance, whereas FIG. 9b illustrates that a capacitor fault is generated upon detecting a difference between the measured impedance and the output of the low-pass filter according to one or more embodiments of the invention disclosed.

FIG. 10a shows a system configuration using one capacitive current sensor per string, with the apparatus for monitoring capacitor faults in a capacitor bank interfacing directly to each of the capacitive current sensors. FIG. 10b shows an alternate system configuration, where the apparatus interfaces with each of the capacitive current sensors via isolating transformers.

DETAILED DESCRIPTION

Figure 1A:
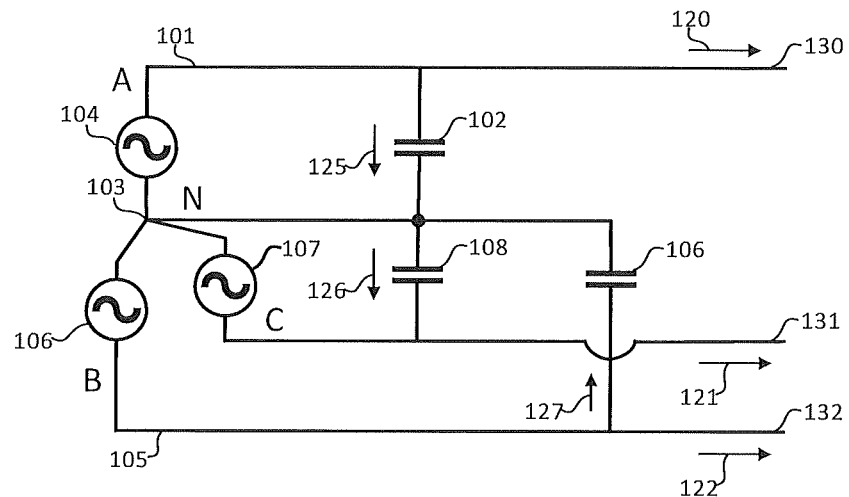
FIGS. 1a and 1b are drawings which illustrate typical connections of capacitor banks in an electrical grid.

In the following description of the embodiments, references to the accompanying drawings are by way of illustration of an example by which one or more of embodiments of the invention may be practiced.

Terms

The term "invention" and the like mean "the one or more inventions disclosed in this application," unless expressly specified otherwise.

The terms "an aspect," "an embodiment," "embodiment," "embodiments," "the embodiment," "the embodiments," "one or more embodiments," "some embodiments," "certain embodiments," "one embodiment," "another embodiment" and the like mean "one or more (but not all) embodiments of the disclosed invention(s)," unless expressly specified otherwise.

A reference to "another embodiment" or "another aspect" in describing an embodiment does not imply that the referenced embodiment is mutually exclusive with another embodiment (e.g., an embodiment described before the referenced embodiment), unless expressly specified otherwise.

The terms "including," "comprising" and variations thereof mean "including but not limited to," unless expressly specified otherwise.

The terms "a," "an" and "the" mean "one or more," unless expressly specified otherwise.

The term "plurality" means "two or more," unless expressly specified otherwise.

The term "herein" means "in the present application, including anything which may be incorporated by reference," unless expressly specified otherwise.

The term "whereby" is used herein only to precede a clause or other set of words that express only the intended result, objective or consequence of something that is previously and explicitly recited. Thus, when the term "whereby" is used in a claim, the clause or other words that the term "whereby" modifies do not establish specific further limitations of the claim or otherwise restricts the meaning or scope of the claim.

The term "e.g." and like terms mean "for example," and thus do not limit the terms or phrases they explain. For example, in a sentence "the computer sends data (e.g., instructions, a data structure) over the Internet," the term "e.g." explains that "instructions" are an example of "data" that the computer may send over the Internet, and also explains that "a data structure" is an example of "data" that the computer may send over the Internet. However, both "instructions" and "a data structure" are merely examples of "data," and other things besides "instructions" and "a data structure" can be "data."

The term "i.e." and like terms mean "that is," and thus limit the terms or phrases they explain. For example, in the sentence "the computer sends data (i.e., instructions) over the Internet," the term "i.e." explains that "instructions" are the "data" that the computer sends over the Internet.

Neither the Title nor the Abstract is to be taken as limiting in any way as the scope of the disclosed invention(s). The title of the present application and headings of sections provided in the present application are for convenience only and are not to be taken as limiting the disclosure in any way.

Numerous embodiments are described in the present application and are presented for illustrative purposes only. The described embodiments are not, and are not intended to be, limiting in any sense. The presently disclosed invention(s) are widely applicable to numerous embodiments, as is readily apparent from the disclosure. One of ordinary skill in the art will recognize that the disclosed one or more embodiments of the invention(s) may be practiced with various modifications and alterations, such as structural and logical modifications. Although particular features of the disclosed invention(s) may be described with reference to one or more particular embodiments and/or drawings, it should be understood that such features are not limited to usage in the one or more particular embodiments or drawings with reference to which they are described, unless expressly specified otherwise.

With all this in mind, one of more embodiments of the present invention are directed to a method and an apparatus for monitoring the faults and defects of capacitor elements in a capacitor bank. It will be appreciated by the skilled addressee that the modern electrical networks, hereafter referred to as the electrical grid, contain large capacitor banks connected to each of the three phases A, B, C of the medium to high voltage transmission and distribution lines. The purpose of these capacitor banks is usually to compensate for the reactive power consumed by the distribution and transport grid and by the load. The capacitor banks will also contribute to filtering of the grid from undesirable voltage harmonics. In many cases, these capacitor banks are connected directly between the medium to high voltage line and the neutral connection of the grid or between two phases of the medium to high voltage lines. The result is such that these capacitor banks will need a string of a high number of discrete capacitors connected in series, to sustain the grid voltage. As a result, the RMS voltage across any of the discrete capacitors will be equal to the RMS line voltage divided by the number of such capacitors connected in series in the string.

It is of common engineering knowledge that the series connection of multiple capacitors will reduce the overall bank capacitance value measured between the line and the neutral. Therefore, in most cases, there is a need to connect many of these capacitor strings in parallel to increase the line capacitance value. Considering the high number of series-connected capacitor in a string and possibly more than one of such strings connected in parallel, the result is a high number of discrete capacitors contained in a capacitor bank.

From an engineering point of view, increasing the number of components in any device will usually also increase the potential of failure or defects in that device. This principle also holds for a capacitor bank connected to the grid, where a failure of a capacitor element will result in short-circuiting the failed capacitor element. Two types of capacitor banks have been disclosed and are currently implemented: fuseless capacitor banks and fused capacitor banks. In a fuseless capacitor bank, the failure of a capacitor element will modify the overall bank capacitance by decreasing its total impedance. In a fused capacitor bank, a short-circuit in one of the capacitor elements will result in blowing a fuse connected in series with the capacitor element, thus resulting in an overall increase in the bank impedance. In either case, there will occur a variation (positive or negative) of the bank impedance and yet, it may still be possible to operate with a failed element for a certain period of time and obtain acceptable performance with avoidance of grid down-time.

In all circumstances, it is required that the fault be communicated to the grid operator, in order to plan for future maintenance. In the case where the number of faults would increase beyond a certain level, it will be required to activate the circuit breaker and de-energize the capacitor bank. For example, a capacitor string containing 50 capacitor elements may tolerate the defect of one capacitor element, but will not tolerate 10 defects. In the case of a 10-defect scenario, the voltage across one capacitor element will increase from 100% to 125% of its nominal value, which would destroy all the capacitors in the string and short-circuit the grid at that point creating significant damage and loss of power.

Figure 1B:
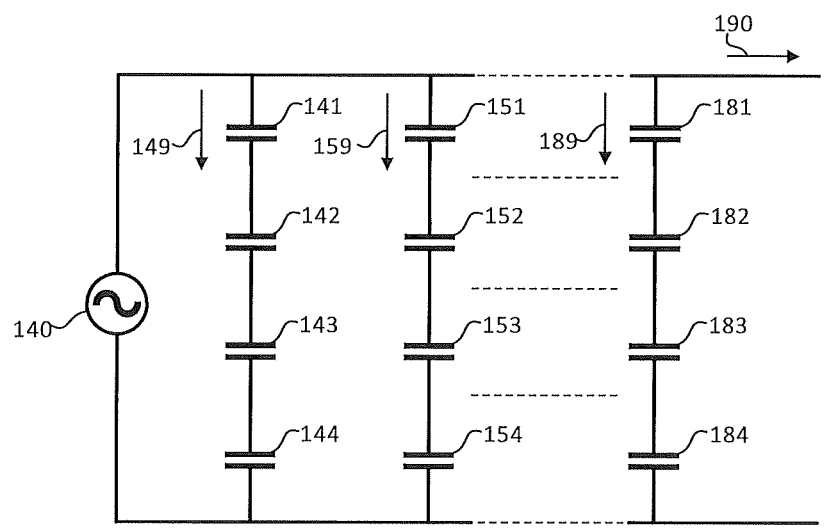

Now referring to FIG. 1a, a general schematic of a capacitor bank is illustrated including phase A capacitors 102, phase B capacitors 106 and phase C capacitors 108. In FIG. 1b, the capacitor bank is shown for one phase only and is formed by a number of strings connected in parallel, each of which contains four capacitor elements in series. A first string is formed by capacitor elements 141, 142, 143, 144 being connected in series. The string current 149 flows in each capacitor element and the phase voltage 140 is applied across the entire string.

Figure 2:
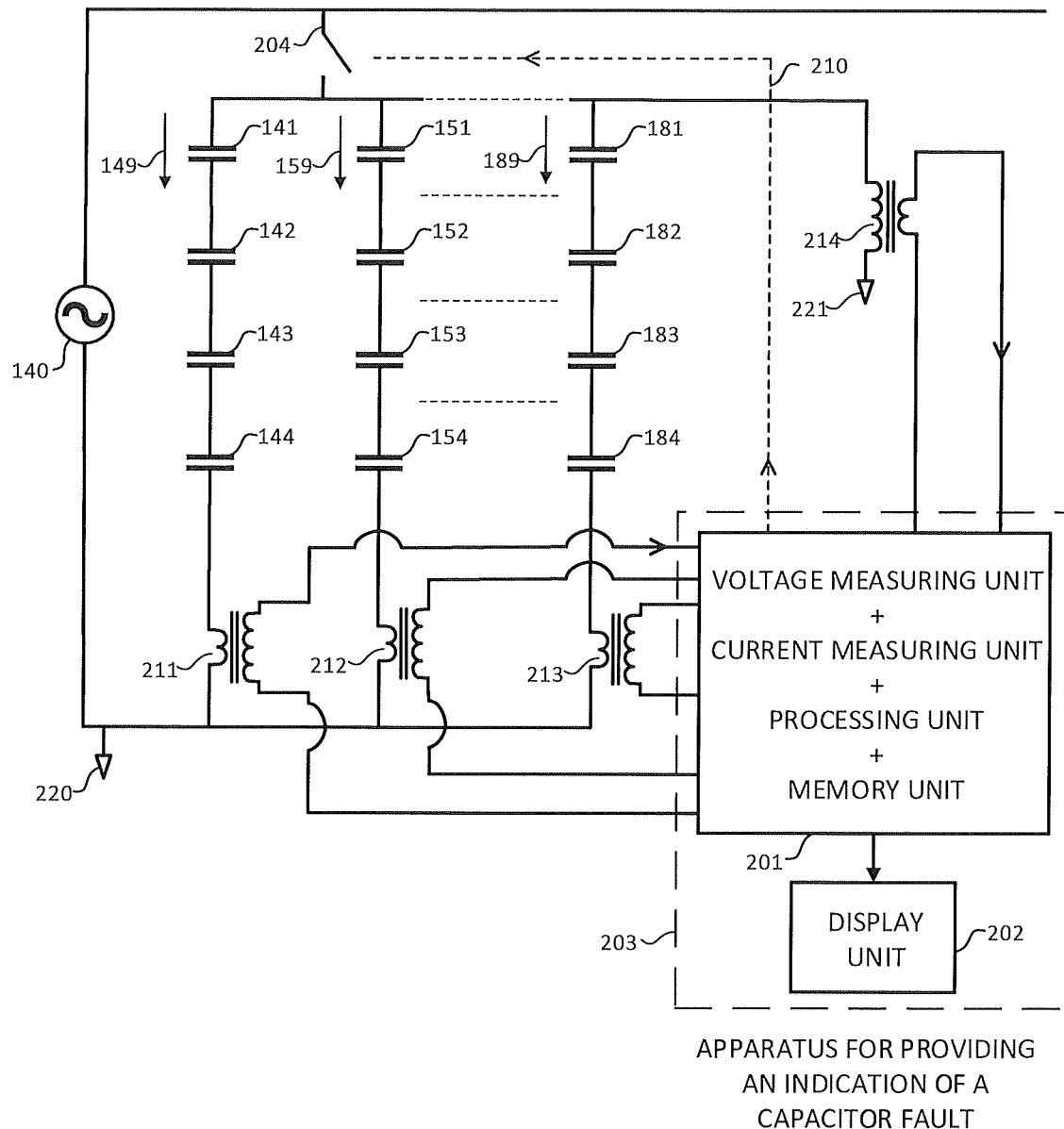
FIG. 2 is a drawing which illustrates a system comprising an embodiment of the apparatus for monitoring capacitor faults in a capacitor bank and including string current measuring devices, a bank voltage measuring transformer and a circuit breaker, connected to a processing unit.

Now referring to FIG. 2, the method disclosed herein is performed by an apparatus for providing an indication of a capacitor fault 203. The apparatus for providing an indication of a capacitor fault 203 comprises, inter alia, a processing unit and is connected to the current transformer 211 to measure the string current 149. The skilled addressee will appreciate that the current transformers 211, 212, 213 enable a monitoring of the current in each of the capacitor strings in the capacitor bank, thus enabling the apparatus for providing an indication of a capacitor fault 203 to measure all the individual string currents 149, 159, 189.

FIG. 2 also shows a voltage transformer 214, which enables the apparatus for providing an indication of a capacitor fault 203 to measure a voltage across the entire capacitor bank. In the embodiment illustrated in FIG. 2, the capacitor bank and the voltage transformer 214 are connected to the neutral point 220, 221 of the grid. In an alternative embodiment, the capacitor bank is connected between two phases and the connection points 220, 221 are to be replaced with a phase connection.

It will be appreciated by the skilled addressee that the measurement of the voltage of the bank and each of the current of the individual strings enables the apparatus for providing an indication of a capacitor fault 203 to determine an impedance value for each of the strings.

According to one or more embodiments of the method disclosed herein, a rapid change of the impedance of a capacitor string is detected by the processing unit of the apparatus for providing an indication of a capacitor fault 203. The embodiment presented in FIG. 2 also discloses a display unit 202 which is used for visually informing a grid operator of any possible failure or default detected in any of the given strings. It will be appreciated that a circuit breaker 204 is usually connected in series with the capacitor bank, which in a preferred embodiment will be triggered by the apparatus for providing an indication of a capacitor fault 203 upon detecting a change in the string impedance that exceeds a given trip threshold.

Figure 3:
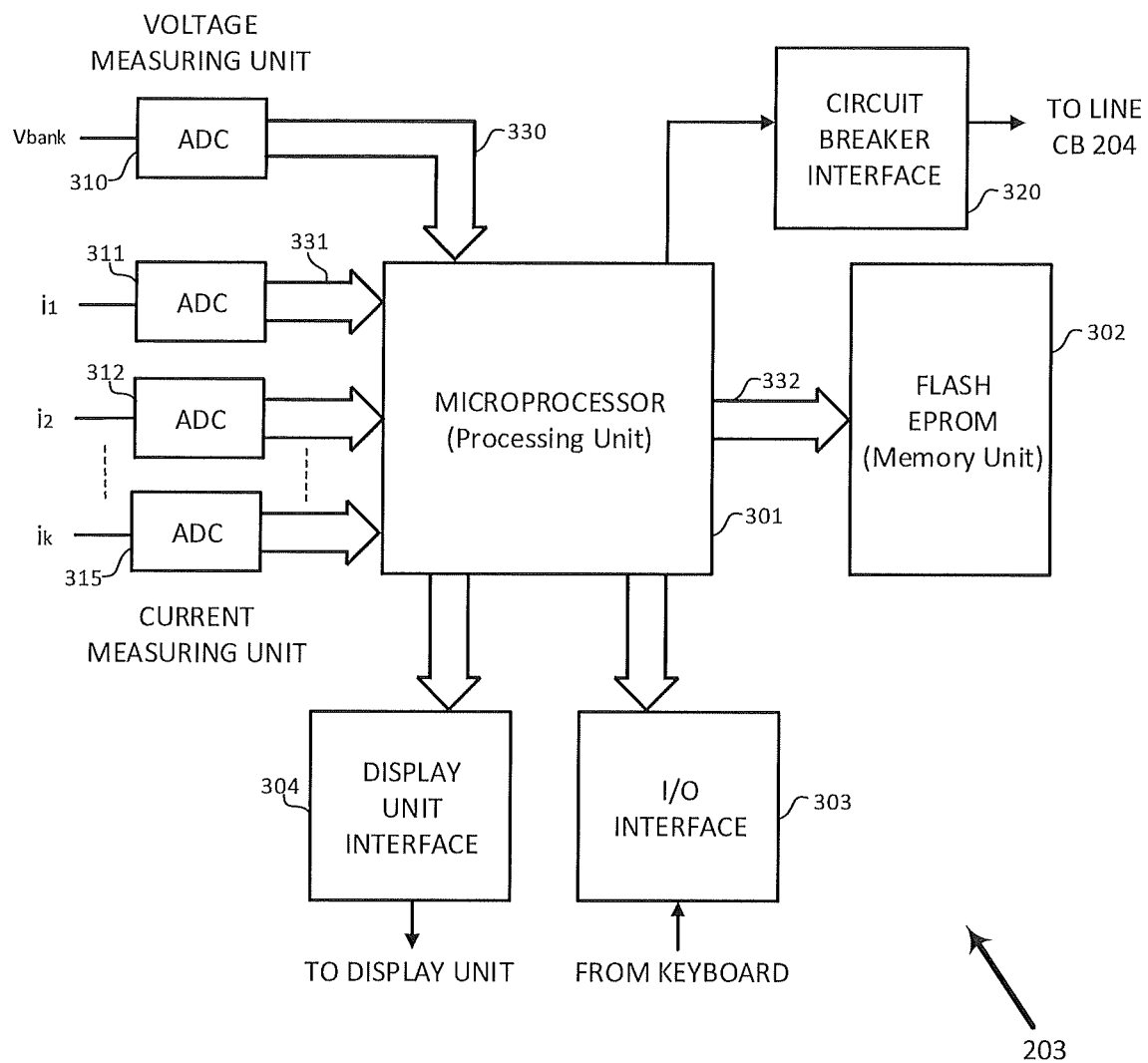
FIG. 3 is a drawing which illustrates an embodiment of the apparatus for monitoring capacitor faults in a capacitor bank. The apparatus comprises, inter alia, a processing unit, a memory unit, a voltage measuring unit and a current measuring unit.

Now referring to FIG. 3, there is disclosed a preferred embodiment of the apparatus for providing an indication of a capacitor fault 203. The apparatus for providing an indication of a capacitor fault 203 comprises a processing unit 301, a voltage measuring unit 310, a current measuring unit comprising a first Analog-to-Digital Converter ADC 311, a second ADC 312 and a $k^{th}$ ADC 315, where k refers to the number of capacitor strings in the capacitor bank. The apparatus for providing an indication of a capacitor fault 203 further comprises a display unit interface 304 and an input/output interface 303.

It will be appreciated that the processing unit 301 may be of various types. In one embodiment, the processing unit 301 comprises a microprocessor. In an alternative embodiment, the processing unit 301 comprises a digital signal processor (DSP). In another alternative embodiment, the processing unit 301 comprises a field-programmable-gate-array (FPGA). The skilled addressee will appreciate that various alternative embodiments may be possible for the processing unit 301.

The voltage measuring unit 310 is used for measuring a voltage of the capacitor bank. It will be appreciated by the skilled addressee that the voltage measuring unit 310 may be of various types. In one embodiment, the voltage measuring unit 310 comprises an analog to digital converter (ADC) 310. The skilled addressee will appreciate that various alternative embodiments may be possible for the analog to digital converter (ADC) 310.

The current measuring unit is used for measuring a current in each string of the capacity bank. It will be appreciated by the skilled addressee that the current measuring unit may be of various types. In one embodiment, the current measuring unit comprises a first ADC 311, a second ADC 312 and a $k^{th}$ ADC 315. The skilled addressee will appreciate that various alternative embodiments may be possible for the current measuring unit, which may interface to a set of k current transformers in one embodiment. In an alternative embodiment, the k ADC 311, 312, 315 comprised in the current measuring unit may also interface to a set of k capacitive current sensors.

The apparatus for providing an indication of a capacitor fault 203 further comprises a memory unit 302 operatively coupled to the processing unit 301. In one embodiment, the memory unit 302 is used for storing data, such as for instance fault status. The skilled addressee will appreciate that various types of memory units may be used.

The apparatus for providing an indication of a capacitor fault 203 further comprises a display interface 304. The display interface 304 is operatively connected to the processing unit 301 and is used for operatively connecting the apparatus for providing an indication of a capacitor fault with a display unit, not shown. The skilled addressee will appreciate that various embodiments may be possible for the display interface 304 depending on the display unit used. It will be appreciated that the indication of a capacitor fault may comprise an indication of a defective capacitor.

Still referring to FIG. 3, it will be appreciated that the apparatus for providing an indication of a capacitor fault 203 is also connected to a circuit breaker interface 320 which enables the triggering of an actuation signal to the circuit breaker 204, if required.

It will be appreciated that the processing unit 301 is used for determining a measured impedance at a grid frequency using the signal indicative of the voltage and the signal indicative of the current flowing in a given string. The processing unit 301 further generates and provides an indication of a capacitor fault if the processing device determines that a difference between the measured impedance and a previously measured impedance stored in the memory unit 302 exceeds a first given threshold for a period of time exceeding a first given duration.

In one embodiment, the processing unit 301 further provides an indication of a capacitor fault in the case where the processing unit 301 determines that a difference between a delayed measured impedance and a filtered impedance generated by filtering the measured impedance exceeds a second given threshold for a second given duration. It will be appreciated that the filtering removes fast variations of the measured impedance over time as further explained below. It will be further appreciated that in such embodiment, the filtering of the measured impedance may comprise outputting the value of the string impedance if the difference between the measured impedance and a previously measured impedance exceeds the second given threshold for a period of time longer than a second given duration.

In one embodiment, the processing unit 301 further determines a number of capacitor faults for the given string of the capacitor bank over a given period of time and further stores this number in the memory unit 302. In one embodiment, the processing unit 301 stores an indication of the difference between the measured impedance and a previously measured impedance if the difference between the measured impedance and a previously measured impedance exceeds a first given threshold for a first given duration.

It will be appreciated that in one embodiment, the indication of the difference stored comprises at least one of an amplitude value and a percentage of a nominal value of a capacitor element.

It will be appreciated that the processing unit 301 further sums each of the stored indication of the difference over a given time duration of interest in accordance with one embodiment.

In another embodiment, the processing unit 301 further computes a string impedance drift for the given string and the computing comprising multiplying the number stored in the memory unit 302 by a corresponding impedance of a capacitor element of the given string of the capacitor bank. In one embodiment, the second given threshold is equal to a proportion of a corresponding nominal impedance of a healthy capacitor element of the string.

In accordance with one embodiment, a communication unit, not shown, is operatively connected to the processing unit 301, the communication unit is used for providing the indication of a capacitor fault to a remote processing unit, also not shown, operatively connected to the communication unit. In accordance with one embodiment, the processing unit 301 generates and provides an alarm signal if the number of capacitor fault reaches a given number.

Figure 4:
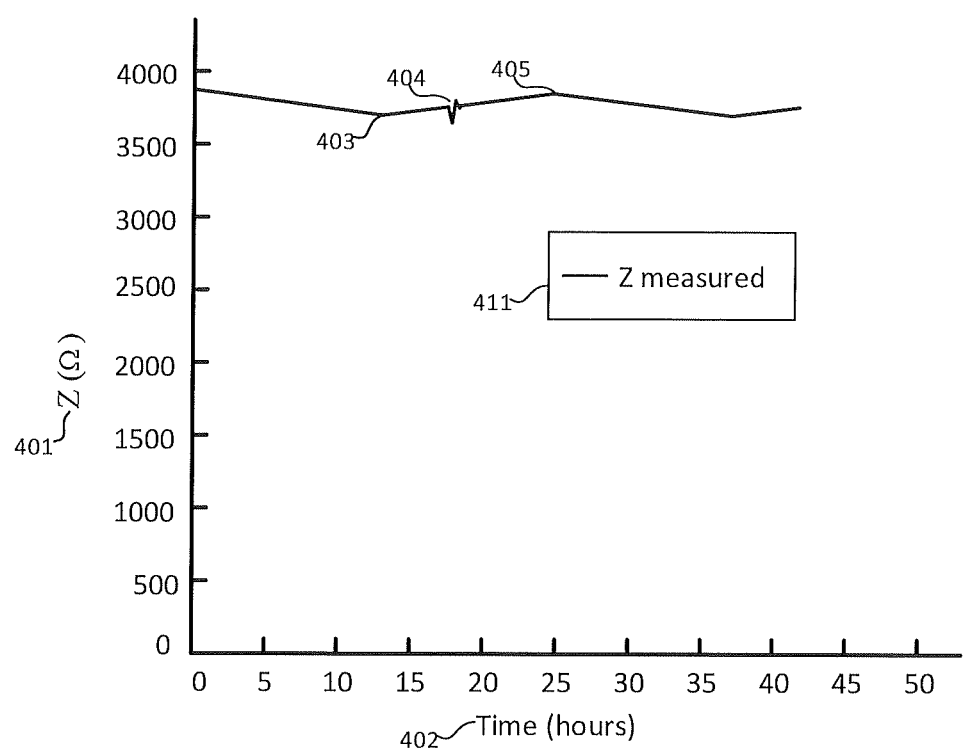
FIG. 4 is a cartesian diagram of a measured impedance of a capacitor string as a function of time in a typical outdoor application, where the impedance value varies naturally of a few percent as the temperature changes throughout the day.

Now referring to FIG. 4, there is illustrated an advantage of one or more embodiments of the method disclosed herein. In fact, it will be appreciated that one or more of the embodiments of the method disclosed herein will not interpret as a failure of a capacitor element a natural variation of the string impedance which occurs in normal operation of the capacitor bank. In fact, the skilled addressee will appreciate that capacitor banks are typically placed in outdoor environment, with possible temperature variations ranging from 20 to 40 degrees Celsius in a 24-hour period, and possibly extreme temperature span of more than 50 degrees Celsius in the course of a one-year period. Such large temperature variations will affect the physical behavior of the dielectrics inside the capacitor elements in a way that the capacitance value will change with temperature. A change in the capacitance of each capacitor element in a string will result in a natural variation in the total string impedance, as illustrated in FIG. 4, where the string impedance naturally varies between a lower value 403 and a higher value 405 in the course of a same day.

It will be appreciated that such a natural occurrence of a string impedance variation with the temperature must not trigger a failure alarm. The method disclosed herein advantageously enables a triggering of a failure alarm upon a rapid change in the measured impedance, whereas a slow variation of the string impedance is not be interpreted as a failure of the capacitor string.

Figure 5:
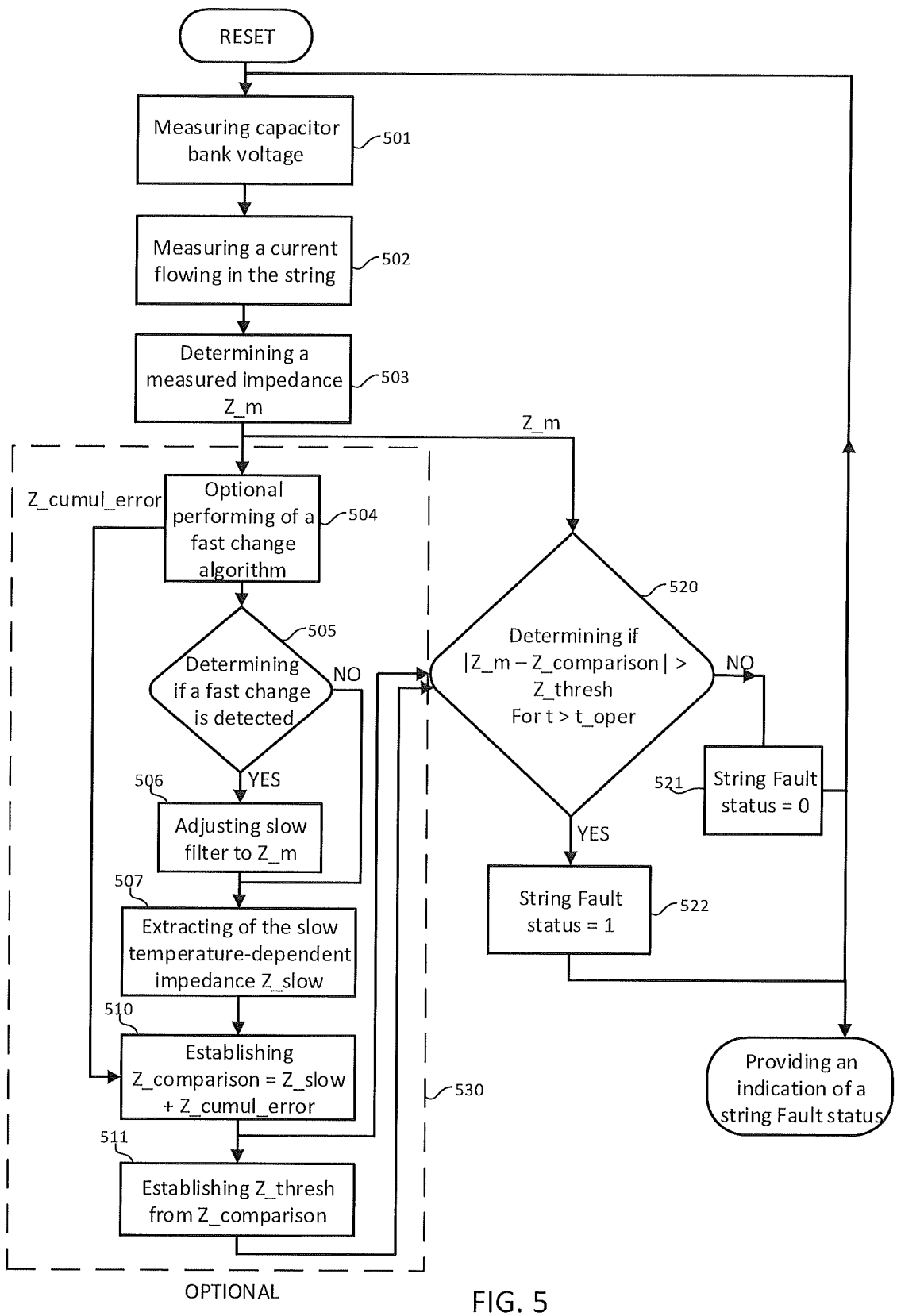
FIG. 5 is a flowchart which shows an embodiment of the method for determining if a fault has occurred in a given capacitor string of the capacitor bank. The method comprises, inter alia, an optional fast change detection algorithm.

Now referring to FIG. 5, there is shown an embodiment of a method for monitoring a change in the string impedance and distinguishing a capacitor defect from a natural variation of the bank capacitance due to temperature.

According to processing step 501, a capacitor bank voltage is measured.

According to processing step 502, a current of the given string is measured.

According to processing step 503, a measured string impedance $Z\_m$ at the grid frequency is determined. It will be appreciated that the measured string impedance is determined using the measured capacitor bank voltage and the measured current of the given string.

According to processing step 504, a status indicating if a fast change is detected is provided along with the sum $Z\_cumul\_error$ of the values of all fast changes detected so far.

It will be appreciated that processing step 504 comprises a Fast Change algorithm, which comprises processing steps 601 to 622, detailed herein below and in FIG. 6.

Now, being understood that the processing step 504 provides a status of whether a fast change in the measured impedance is detected, a test is performed, according to processing step 505, in order to determine if a Fast Change is detected.

According to processing step 506, a low-pass filter filtering, also referred to as a slow filter, is performed. It will be appreciated that the filtering has, in one embodiment, a cut-off frequency lower than 0.2 Hz and is implemented digitally in accordance with one embodiment. Electronic analog filtering may also be comprised within processing step 506 in accordance with another embodiment. More precisely, the measured impedance Z_m is filtered and a slow frequency component of Z_m is outputted provided that no fast change has been detected by the Fast Change algorithm performed at processing step 504. In the case where the Fast Change algorithm performed at processing step 504 provides a Status such that a Fast Change has occurred, the filtering performed at processing step 506 will adjust its output so that its output is equal to the latest value of Z_m provided according to processing step 503. It will be appreciated that such a reset of the slow filter used at processing step 506, as soon as a fast change is detected, will enable a fast reaction of the system where multiple capacitor failures could occur in a short time span which is of great advantage.

According to processing step 507, the output of the slow filter described in processing step 506 is used as an estimate of the temperature-dependent impedance of the capacitor string considered, wherein processing step 507 will yield Z_slow.

According to processing step 510, a value Z_comparison is calculated by summing Z_slow and Z_cumul_error respectively outputted at processing step 507 and at processing step 504. It will be appreciated that the Z_cumul_ error output of processing step 504 will be adjusted simultaneously with the output of the slow filter function performed at processing step 506. This feature ensures that Z_comparison calculated at processing step 510 will maintain its value before and after a detection of a fast change.

According to processing step 511, Z_thresh is established as a proportion of Z_comparison.

It will be appreciated by the skilled addressee that processing steps 504 to 511 are optional in the embodiment disclosed FIG. 5. The skilled addressee will therefore appreciate that the use of processing steps 504 to 511 discloses an alternative embodiment of the method disclosed herein.

According to processing step 520, a test is performed in order to find out if the condition Z_m−Z_comparison>Z_thresh is true. It will be appreciated that a capacitor defect is detected during this processing step. The impedance Z_m that was determined at processing step 503 is compared to the value Z_comparison. If the difference between the impedance Z_m and the value Z_comparison is small compared to a reference threshold value Z_thresh, a capacitor fault status is not issued, whereas larger difference between Z_m and Z_comparison for a time period longer than t_oper will be interpreted as a faulty capacitor element in the string.

According to processing step 521, a String Fault Status flag is set to 0 if the condition tested at processing step 520 is not true. In other words, if the measured impedance Z_m remains approximately equal to the comparison value Z_comparison, no fault is detected.

According to processing step 522, a String Fault Status flag is set to 1 if the condition tested at processing step 520 is true. In other words, if the measured impedance Z_m varies from the comparison value Z_comparison by a value exceeding Z_thresh, a fault is detected.

The fast change detection algorithm performed at processing step 504 comprises the detection of a fast variation of the measured impedance Z_m and resets the slow filter output at processing step 506 such that Z_slow=Z_m in order to be quickly ready for upcoming fault events. The fast change algorithm performed at processing step 504 also cumulates the total variation Z_cumul_error in the string impedance caused by defects in the capacitor elements. Z_cumul_error is updated with the amplitude of the fast variation at the same time as the slow filter output is reset to the value Z_m. Thus, it ensures that the comparison value Z_comparison stays the same just before and just after a fast change is detected. It will be appreciated that this processing step is of great advantage as it enables the slow filter to continue to feed through the slow component of the measured impedance after a fault event has been detected. If the total variation Z_cumul_error was not added to the comparison value Z_comparison, the fault would clear on its own as Z_slow would slowly converge to the new value of the value Z_m at rate dictated by the time constant of the slow filter.

Figure 6:
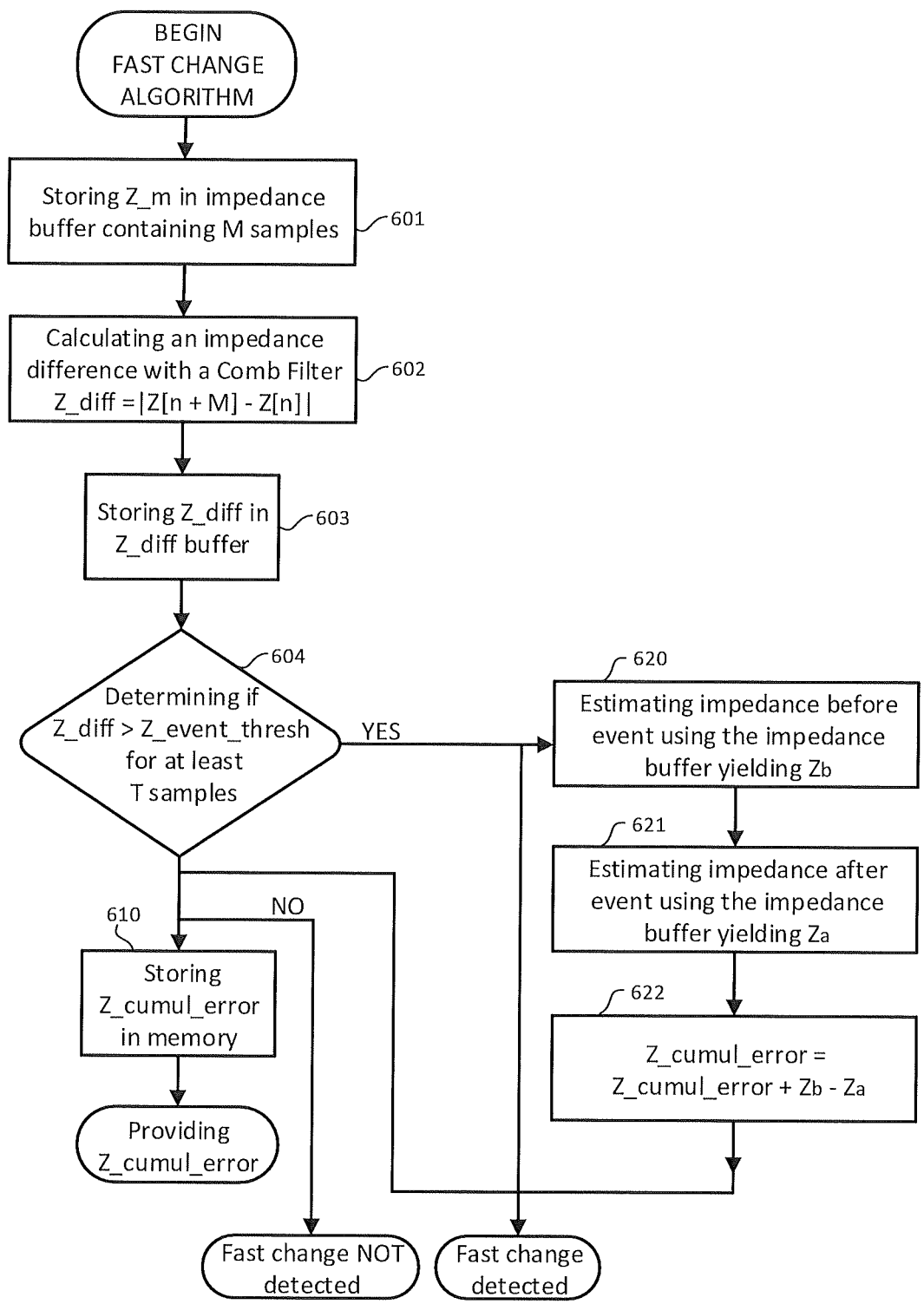
FIG. 6 is a flowchart which shows an embodiment of a fast change detection algorithm.

Now referring to FIG. 6, there is disclosed an embodiment of the Fast Change Algorithm. The Fast Change Algorithm is performed at processing step 504 shown in FIG. 5 and described previously.

According to processing step 601, the last M samples of the measured impedance value Z_m are stored. In one embodiment, the last M samples of the measured impedance value Z_m are stored in an impedance buffer.

According to processing step 602, a difference Z_diff is calculated between the impedance of the last sample of the measured impedance and the first sample of the measured impedance which is the first stored measured impedance in the impedance buffer, giving a non-zero value upon any change in the measured impedance within the last M samples. In one embodiment, the difference is calculated using a comb filter. The skilled addressee will appreciate that various alternative embodiments may be used for calculating the difference.

According to processing step 603, the last value of Z_diff extracted at processing step 602 as well as the M−1 previous values of Z_diff extracted at processing step 602 are stored in a difference buffer Z_diff_buffer. The Z_diff_buffer therefore comprises M elements.

According to processing step 604, a test is performed in order to find out if the difference buffer Z_diff_buffer contains at least T elements with values greater than a threshold value Z_event_thresh. If the condition Z_diff>Z_event_thresh is true for T samples, a rapid change of the measured impedance is detected.

The skilled addressee will appreciate that checking the condition for a number of T samples out of the M elements contained in the Z_diff buffer will enable a rejection of false positive detection caused for instance by noise or very short transients. On the other hand, increasing the value of T will increase the response time of the rapid change detection.

In the case where the absolute value of Z_diff exceeds Z_event_thresh for at least T samples, as determined at processing step 604, a cumulative error impedance Z_cumul_error is updated by increasing its value to take into account the faults previously recorded and the new fault detected in the capacitor string. It will be appreciated that the indication of the difference stored, i.e. the cumulative error impedance Z_cumul_error comprises at least one of an amplitude value and a percentage of a nominal value of a capacitor element.

According to steps 620 and 621, the impedance buffer is used for estimating respectively the impedance before the fast change event yielding Zb and after the fast change event yielding Za. It will be appreciated that the impedance buffer of processing step 601 contains M samples, a portion of which corresponds to impedance measurement samples before the fast change event, another portion corresponds to impedance measurement samples after the fast change event.

According to processing step 622, the sum of the current fast event Zb−Za is provided to the cumulative error impedance Z_cumul_error accumulator. It will be appreciated that the cumulative error impedance Z_cumul_error will contain the sum of the current detected fast change amplitude and all the previous fast changes amplitudes.

According to processing step 610, the value of the cumulative error impedance Z_cumul_error is stored in the memory unit 302.

Figure 7A:
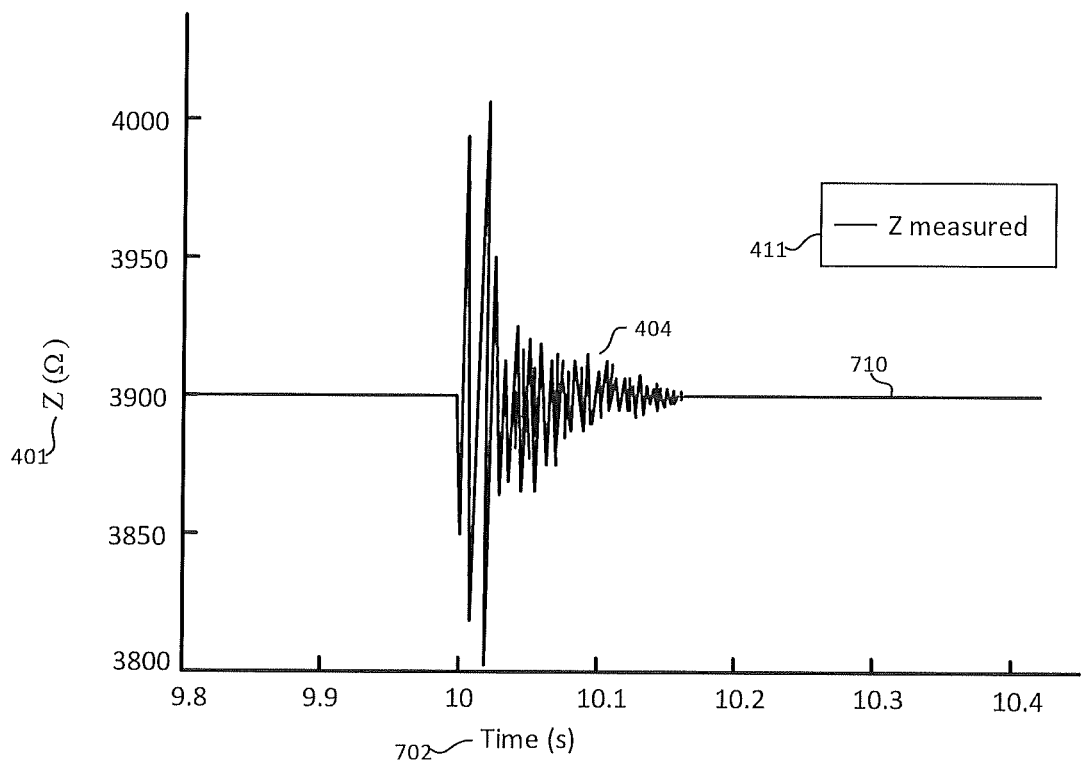
FIGS. 7a and 7b are cartesian diagrams depicting an example of the effect of one or more embodiments of the method disclosed herein in the case where a voltage transient occurs in the bank voltage.
Figure 7B:
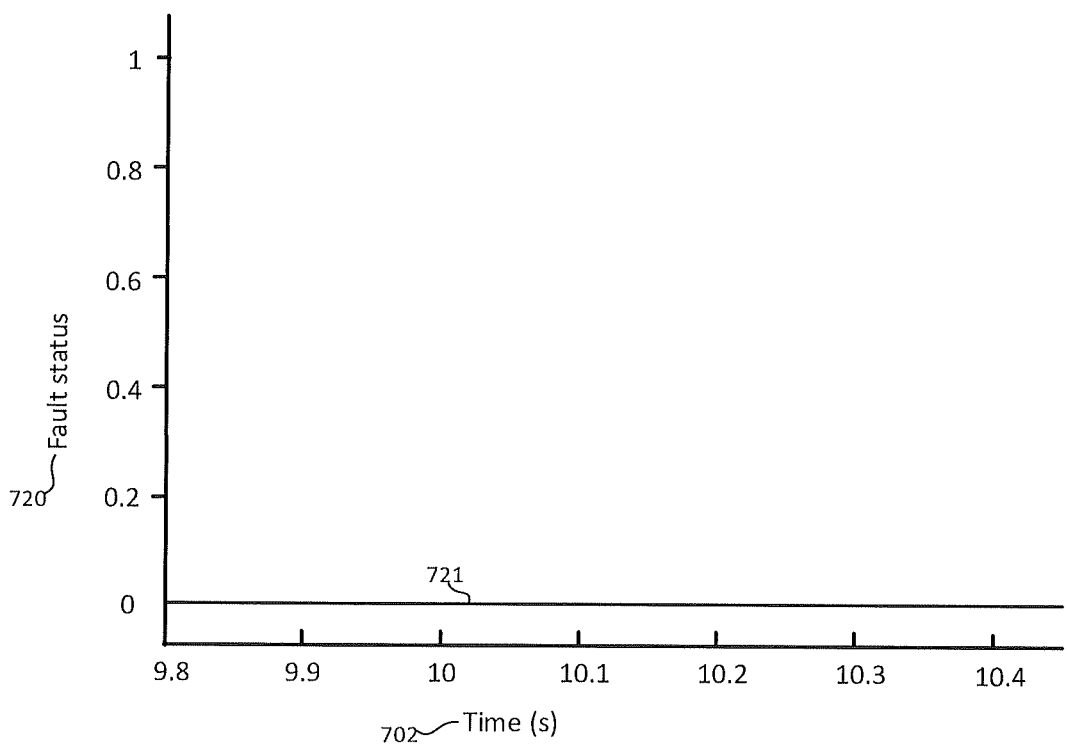

Now referring to FIGS. 7a and 7b, it will be appreciated that the method disclosed herein does not generate a fault status in cases where the measured impedance undergoes a sudden variation centered around a given impedance value as depicted in FIG. 7a. This case was disclosed in FIG. 4, where a rapid burst 404 occurs due to a voltage transient in the phase voltage. Thanks to the action of the slow low-pass filter, the minute-range impedance value does not change. This is shown in the measured impedance Z_m holding the same value of 3900 ohms before and after the burst 404. As a net result, the Fault Status 720 displayed in FIG. 7b maintains a low state 721, which is of great advantage.

Figure 8A:
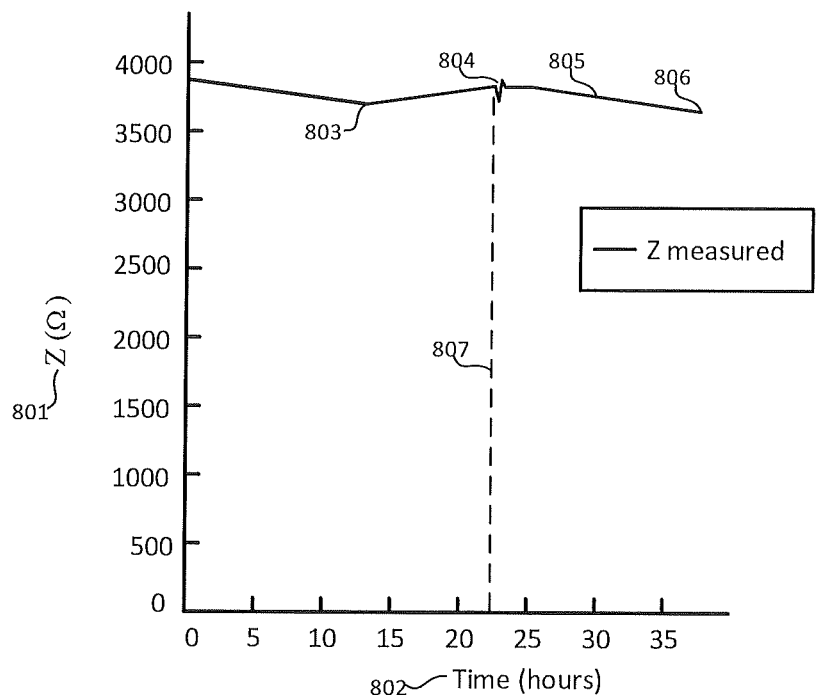
FIGS. 8a and 8b are cartesian diagrams depicting an example of the effect of one or more embodiments of the method disclosed herein in the case where a capacitor fault occurs in a given string.
Figure 8B:
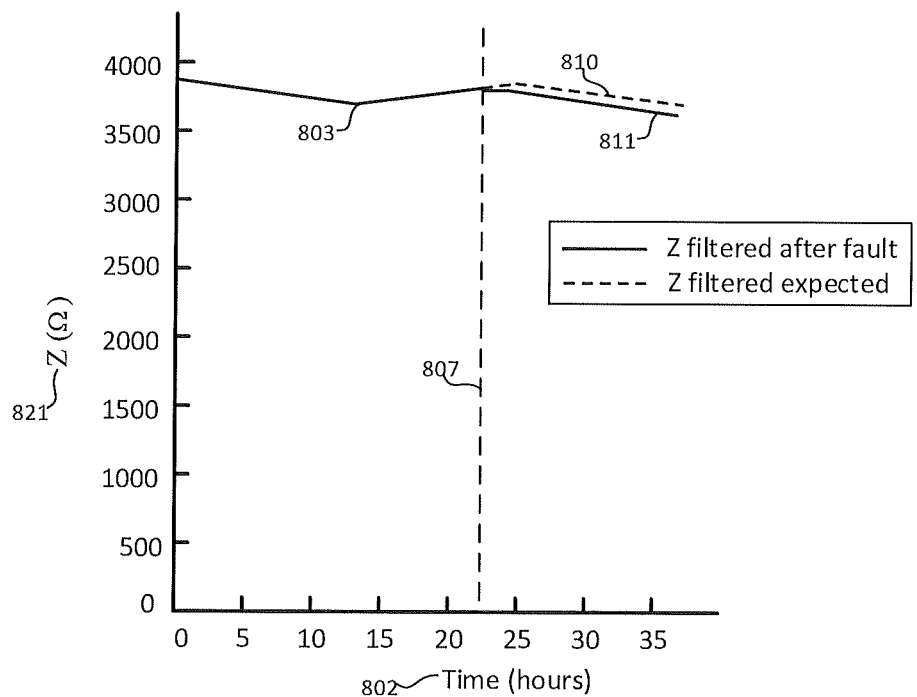

Referring now to FIGS. 8a and 8b, a short-circuit 804 in the capacitor string considered occurs at time t=22 hour. FIG. 8b shows the output of the slow minute-range low-pass filter, where the instantaneous disturbance 804 is not recorded, but where the long term filtered value of the measured impedance is modified after the short-circuit of the capacitor element has occurred. The curve 810 displays the behavior of the measured capacitance in the case with no defect occurring in the considered string, whereas curve 811 shows the filtered measured impedance after such a short-circuit has occurred.

Figure 9A:
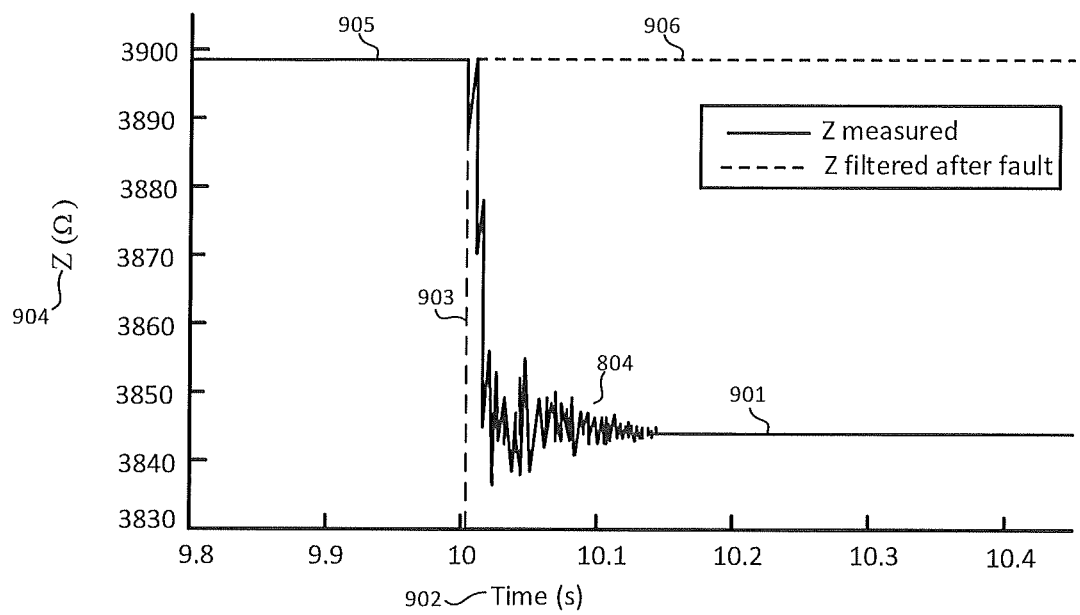
FIGS. 9a and 9b are cartesian diagrams depicting an example of the effect of one or more embodiments of the method disclosed herein, in the case where one of the capacitor elements, among all capacitors in the string considered, fails with a short-circuited behavior.
Figure 9B:
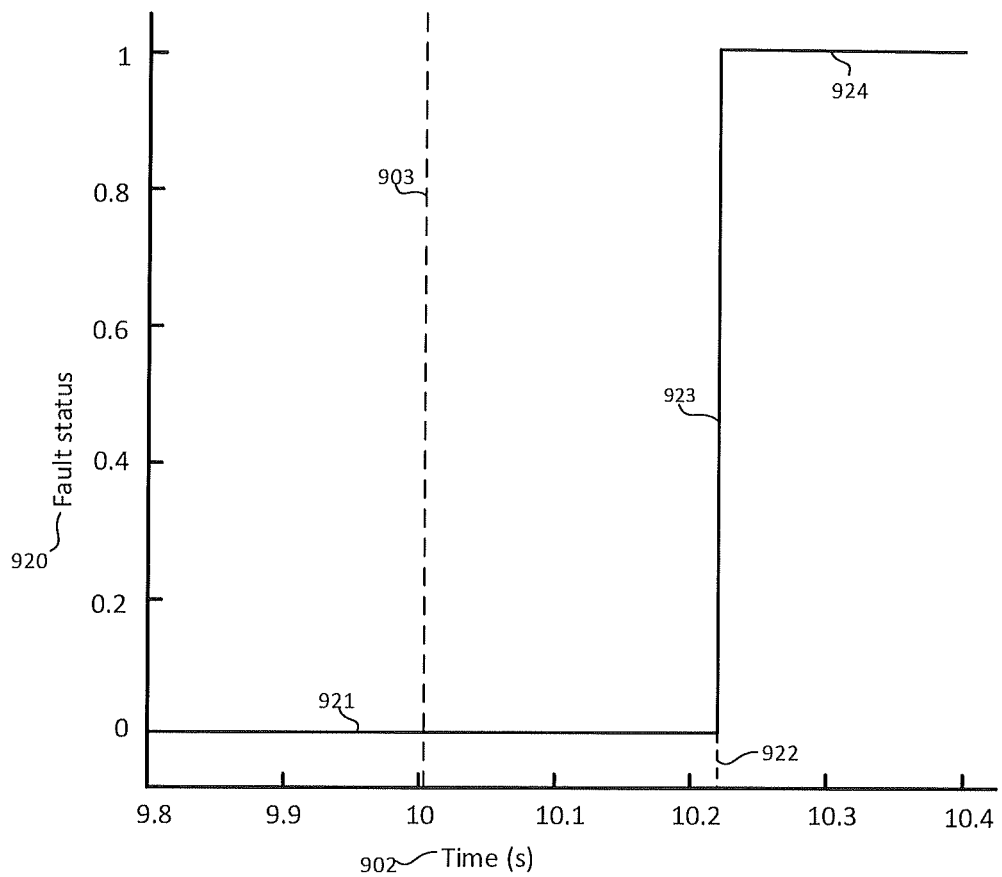

The skilled addressee will appreciate the difficulty of illustrating the effect of the method disclosed herein on a time scale of 5 hour per time division. For a better understanding of the various mechanisms implied by the method disclosed herein, FIGS. 9a and 9b provide a detailed analysis of the different variables for a time scale of 0.1 second per division. In FIG. 9a is shown the disturbance 804 associated to the short-circuit of one of the capacitors in the string. The event occurs at the dotted line 903, after which the measured string impedance Z_m decreases by a value of 60 ohms over a time period of about 0.1 second, after which the measured impedance keeps a steady-state value of 3840 ohms. The skilled addressee will appreciate that the slow minute-range low-pass filter will retain a value of 3900 ohms during a period extending over the graph window, due to the large time constant associated to the filter. This drift between the output of the slow low-pass filter and the fast variation of the measured string impedance is one of the main constituents of method disclosed. The skilled addressee will easily appreciate that the two variables 901 and 906 can be subtracted from one another, thus obtaining a difference that is to be compared to a threshold impedance. If the condition of Z_m−Z_comparison>Z_thresh remains true for an operating time, herein defined as the time difference between the dotted line 922 and the dotted line 903, then a fault status of 1 is issued as 924 indicated in FIG. 9b after the time line 922.

Figure 10A:
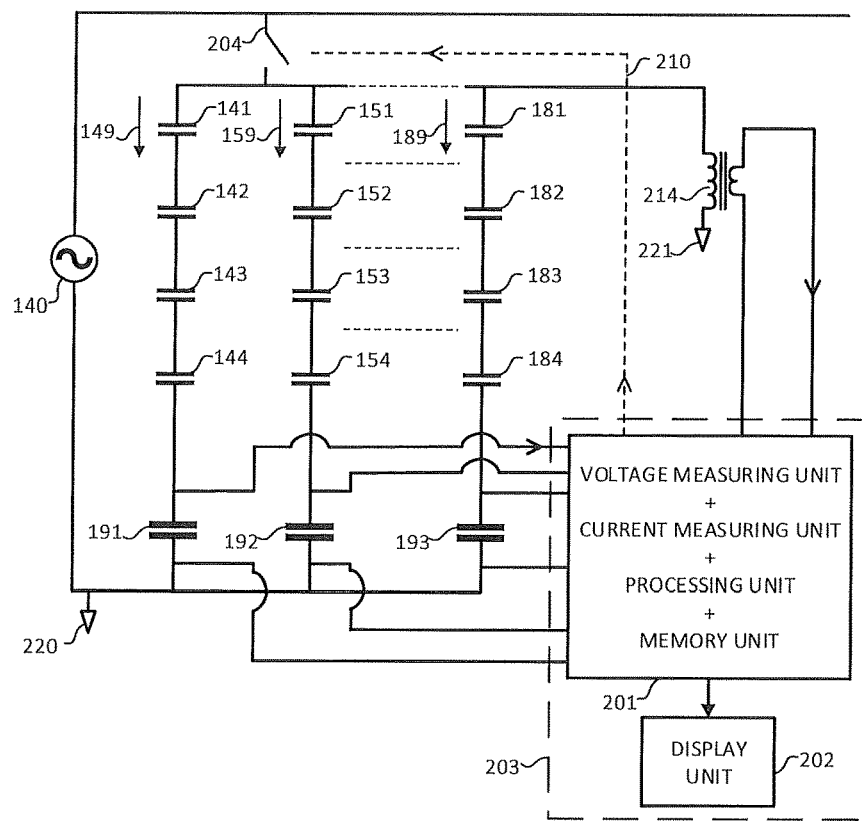
FIGS. 10a and 10b are drawings which illustrate an embodiment of the system comprising the apparatus for monitoring capacitor faults in a capacitor bank, in the case where the current flowing in each of the capacitor strings is sensed by measuring the voltage across a capacitive current sensor.

Now referring to FIG. 10a, it will be appreciated that the method disclosed herein is performed by an apparatus for providing an indication of a capacitor fault 203, where in an alternative embodiment, the apparatus 203 is connected to capacitive current sensors 191, 192, 193 and processes the voltage measured across each of these capacitive current sensors to derive the value of the current 149, 159, 189 flowing in each of the strings of the capacitor bank. This alternative embodiment of the system may be implemented in the cases where the grid operator will prefer using such capacitive current sensors instead of the more common current transformers. As a matter of fact, using a very accurate value for such capacitive current sensors will lead to an accurate determination of the currents 149, 159, 189 which will be proportional to the voltage across the capacitive sensors and also proportional to the capacitance value of the capacitive current sensors used.

Figure 10B:
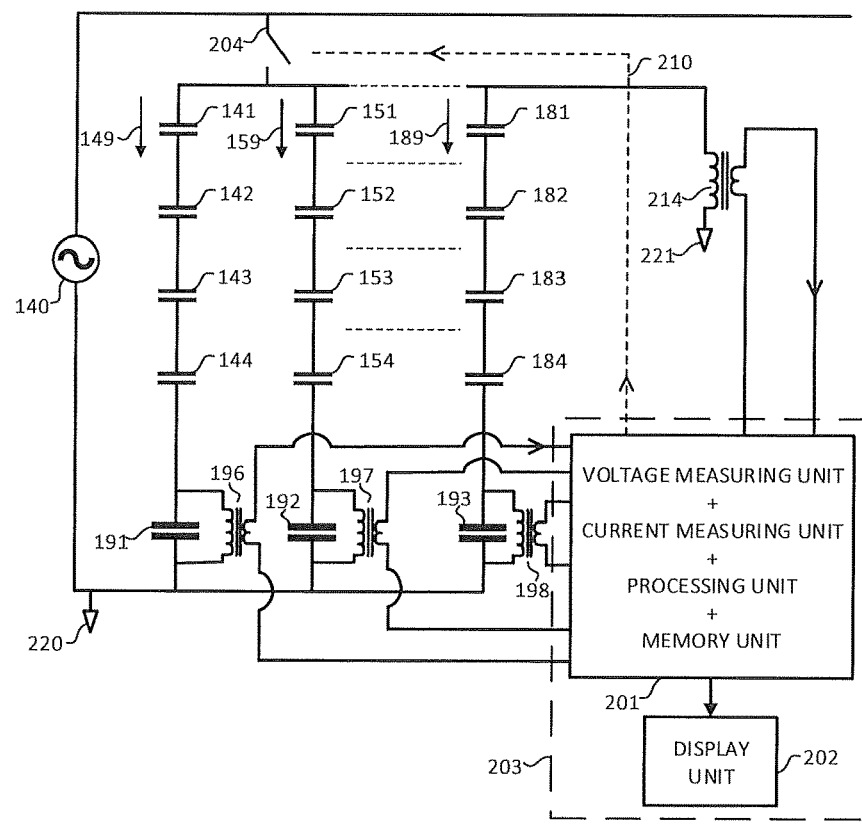

It will be appreciated by the skilled addressee that connecting the apparatus 203 to the capacitive current sensors 191, 192, 193 through isolating transformers 196, 197, 198, as shown in FIG. 10b enables a higher degree of safety and protection against any hazardous grid malfunction or overvoltage. Such isolating voltage transformers 196, 197, 198 may also contribute to stepping down of the measured voltage for a better adaption to the low voltages needed at the input of the apparatus 203.

It will be appreciated that there is also disclosed a method for identifying a defect in a capacitor bank wherein the method disclosed above is performed for each string of the at least one string of the capacitor bank.

Although the above description relates to a specific preferred embodiment as presently contemplated by the inventor, it will be understood that the invention in its broad aspect includes functional equivalents of the elements described herein.

The invention claimed is:

1. A method for providing an indication of a capacitor fault in a given string of a capacitor bank comprising at least one string mounted in parallel, each string comprising a plurality of capacitor elements connected in series, the method comprising:
    obtaining a capacitor bank voltage, the obtaining comprising measuring a voltage across the capacitor bank;
    obtaining a current of the given string, the obtaining of the current of the given string comprising measuring a current flowing in the given string of the capacitor bank;
    determining a measured impedance at a grid frequency using the obtained capacitor bank voltage and the obtained current of the given string; and
    providing an indication of a capacitor fault if a difference between the measured impedance and a previously measured impedance exceeds a first given threshold for a first given duration; and wherein the indication of a capacitor fault is also provided if a difference between a delayed measured impedance and a filtered impedance generated by filtering the measured impedance exceeds a second given threshold for a second given duration, the filtering comprising performing a temporal filtering for removing fast variations of the determined impedance over time.

2. The method as claimed in claim 1, wherein the indication of a capacitor fault comprises an indication of a defective capacitor.

3. The method as claimed in claim 1, wherein the indication of a capacitor fault is also provided if a fast variation of impedance is detected using at least one filter.

4. The method as claimed in claim 2, wherein the filtering of the measured impedance comprises providing the measured impedance if the difference between the measured impedance and a previously measured impedance exceeds the second given threshold for a second given duration.

5. The method as claimed in claim 1, further comprising counting a number of capacitor fault provided for the given string of the capacitor bank over a given period of time and storing an indication of said number in a memory.

6. The method as claimed in claim 1, further comprising storing an indication of the difference between the measured impedance and a previously measured impedance if the difference between the measured impedance and a previously measured impedance exceeds a first given threshold for a first given duration.

7. The method as claimed in claim 6, wherein the indication of the difference stored comprises at least one of an amplitude value and a percentage of a nominal value of a capacitor element.

8. The method as claimed in claim 6, further comprising adding each of the stored indication of the difference over a given time duration of interest.

9. The method as claimed in claim 5, further comprising computing a string impedance drift for the given string, the computing comprising multiplying the number stored in the memory by a corresponding impedance of a capacitor element of the given string of the capacitor bank.

10. A method for identifying a defect in a capacitor bank comprising performing the method as claimed in any one of claim 5 and claim 6 for each string of the at least one string of the capacitor bank.

11. The method as claimed in claim 1, wherein the second given threshold is equal to a proportion of a corresponding nominal impedance of a healthy capacitor element of the string.

12. The method as claimed in claim in claim 1, wherein the fast variations are characterized by a frequency greater than ⅕ Hz.

13. The method as claimed in claim 1, wherein the measuring of the current flowing in the given string of the capacitor bank comprises measuring a voltage at a corresponding capacitive current sensor located in the given string.

14. The method as claimed in claim 13, wherein the measuring of the voltage is performed via an insulating transformer.

15. An apparatus for providing an indication of a capacitor fault in a given string of a capacitor bank comprising at least one string mounted in parallel, each string comprising a plurality of capacitor elements connected in series, the apparatus comprising:
a voltage measuring unit operatively connected to a capacitor bank, the voltage measuring unit for measuring a voltage across the capacitor bank and providing a signal indicative of the voltage;
a current measuring unit operatively connected to the given string, the current measuring unit for measuring a current flowing in the given string and providing a signal indicative of the current flowing in the given string;
a memory unit; and
a processing unit operatively connected to the voltage measuring unit, to the current measuring unit and to the memory unit, the processing unit receiving the signal indicative of the voltage and the signal indicative of the current flowing in the given string and determining a measured impedance at a grid frequency using the signal indicative of the voltage and the signal indicative of the current flowing in the given string, the processing unit further generating and providing an indication of a capacitor fault if the processing device determines that a difference between the measured impedance and a previously measured impedance stored in the memory unit exceeds a first given threshold for a first given duration; and wherein the processing unit further provides the indication of a capacitor fault if the processing unit determines that a difference between a delayed measured impedance and a filtered impedance generated by filtering the measured impedance exceeds a second given threshold for a second given duration, the filtering comprising performing a temporal filtering for removing fast variations of the determined impedance over time.

16. The apparatus as claimed in claim 15, wherein the processing unit further determine a number of capacitor fault provided for the given string of the capacitor bank over a given period of time and further stores an indication of said number in the memory unit.

17. The apparatus as claimed in claim 15, wherein the processing unit stores an indication of the difference between the measured impedance and a previously measured impedance if the difference between the measured impedance and a previously measured impedance exceeds a first given threshold for a first given duration.

18. The apparatus as claimed in claim 17, wherein the indication of the difference stored comprises at least one of an amplitude value and a percentage of a nominal value of a capacitor element.

19. The apparatus as claimed in claim 17, wherein the processing unit further add each of the stored indication of the difference over a given time duration of interest.

20. The apparatus as claimed in claim 16, wherein the processing unit further computes a string impedance drift for the given string, the computing comprising multiplying the number stored in the memory unit by a corresponding impedance of a capacitor element of the given string of the capacitor bank.

21. The apparatus as claimed in claim 15, wherein the second given threshold is equal to a proportion of a corresponding nominal impedance of a healthy capacitor element of the string.

22. The apparatus as claimed in claim 15, further comprising a display unit operatively connected to the processing unit, the display unit for providing the indication of a capacitor fault.

23. The apparatus as claimed in claim 15, further comprising a communication unit operatively connected to the processing unit, the communication unit for providing the indication of a capacitor fault to a remote processing unit operatively connected to the communication unit.

24. The apparatus as claimed in claim 16, wherein the processing unit generates and provides an alarm signal if the number of capacitor fault reaches a given number.

25. The apparatus as claimed in claim 15, wherein the filtering of the measured impedance comprises providing the measured impedance if the difference between the measured impedance and a previously measured impedance exceeds the second given threshold for a second given duration.

* * * * *